United States Patent
Grunzke (10) Patent No.: US 8,570,063 B2
(45) Date of Patent: Oct. 29, 2013

(54) METHODS AND APPARATUSES INCLUDING AN ADJUSTABLE TERMINATION IMPEDANCE RATIO

(75) Inventor: Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 13/281,139

(22) Filed: Oct. 25, 2011

(65) Prior Publication Data

US 2013/0099818 A1   Apr. 25, 2013

(51) Int. Cl.
*H03K 19/003* (2006.01)

(52) U.S. Cl.
USPC .............................. 326/30; 326/32

(58) Field of Classification Search
USPC .............................. 326/21, 30–34
See application file for complete search history.

(56) References Cited

U.S. PATENT DOCUMENTS

| | | | |
|---|---|---|---|
| 6,515,501 B2 * | 2/2003 | Bosnyak et al. | 326/30 |
| 7,064,989 B2 | 6/2006 | Na et al. | |
| 7,443,741 B2 | 10/2008 | Butt et al. | |
| 7,482,832 B2 * | 1/2009 | Koshita | 326/30 |
| 7,495,468 B2 | 2/2009 | You et al. | |
| 7,710,144 B2 * | 5/2010 | Dreps et al. | 326/30 |
| 7,742,347 B2 | 6/2010 | Lee et al. | |
| 7,761,714 B2 * | 7/2010 | Luzzi et al. | 713/182 |
| 2005/0001650 A1 * | 1/2005 | Schafer | 326/30 |
| 2010/0195421 A1 | 8/2010 | Jeddeloh | |
| 2010/0332921 A1 | 12/2010 | Schaefer | |
| 2012/0042148 A1 | 2/2012 | Grunzke | |

OTHER PUBLICATIONS

"DDR3 Dynamic On-Die Termination", Micron Technical Note TN-41-04, [Online]. Retrieved from the Internet: <URL: http://www.micron.com/~/media/Documents/Products/Technical%20Note/DRAM/TN4104.pdf>, (2008), 5 pgs.

"DDR3 ZQ Calibration", Micron Technical Note TN-41-02, [Online]. Retrieved from the Internet: <URL: http://www.micron.com/~/media/Documents/Products/Technical%20Note/DRAM/TN4102.pdf>, (2008), 5 pgs.

"How to Use DDR2 SDRAM", Elpida User's Manual, [Online]. Retrieved from the Internet: <URL: http://www.elpida.com/pdfs/E0437E40.pdf>, (2007), 40 pgs.

* cited by examiner

*Primary Examiner* — James H Cho
(74) *Attorney, Agent, or Firm* — Schwegman, Lundberg & Woessner, P.A.

(57) ABSTRACT

Methods of adjusting a centerline voltage of a data signal are described, along with apparatuses to adjust the centerline voltage. In one such method, portions of a termination circuit coupled to a node are selectively programmed to adjust an impedance of the termination circuit to adjust the centerline voltage of the data signal driven to the node. One such apparatus includes pull-up impedances and pull-down impedances that can be programmed to adjust the centerline voltage of the data signal. Additional embodiments are also described.

16 Claims, 6 Drawing Sheets

METHODS AND APPARATUSES INCLUDING AN ADJUSTABLE TERMINATION IMPEDANCE RATIO

BACKGROUND

Semiconductor devices are widely used in many systems such as personal digital assistants (PDAs), laptop computers, mobile phones and digital cameras. Semiconductor devices drive data signals within performance specifications so that other components in a system can properly receive the data signals.

BRIEF DESCRIPTION OF THE DRAWINGS

Some embodiments are illustrated by way of example and not limitation in the figures of the accompanying drawings in which.

DETAILED DESCRIPTION

In this description, a transistor is described as being activated or switched on when it is rendered conductive by a control terminal voltage that is separated from its source voltage by at least its threshold voltage. The transistor is described as being in an inactive state or switched off when the control terminal voltage is separated from its source voltage by less than the threshold voltage and the transistor is rendered non-conductive.

Figure 1:
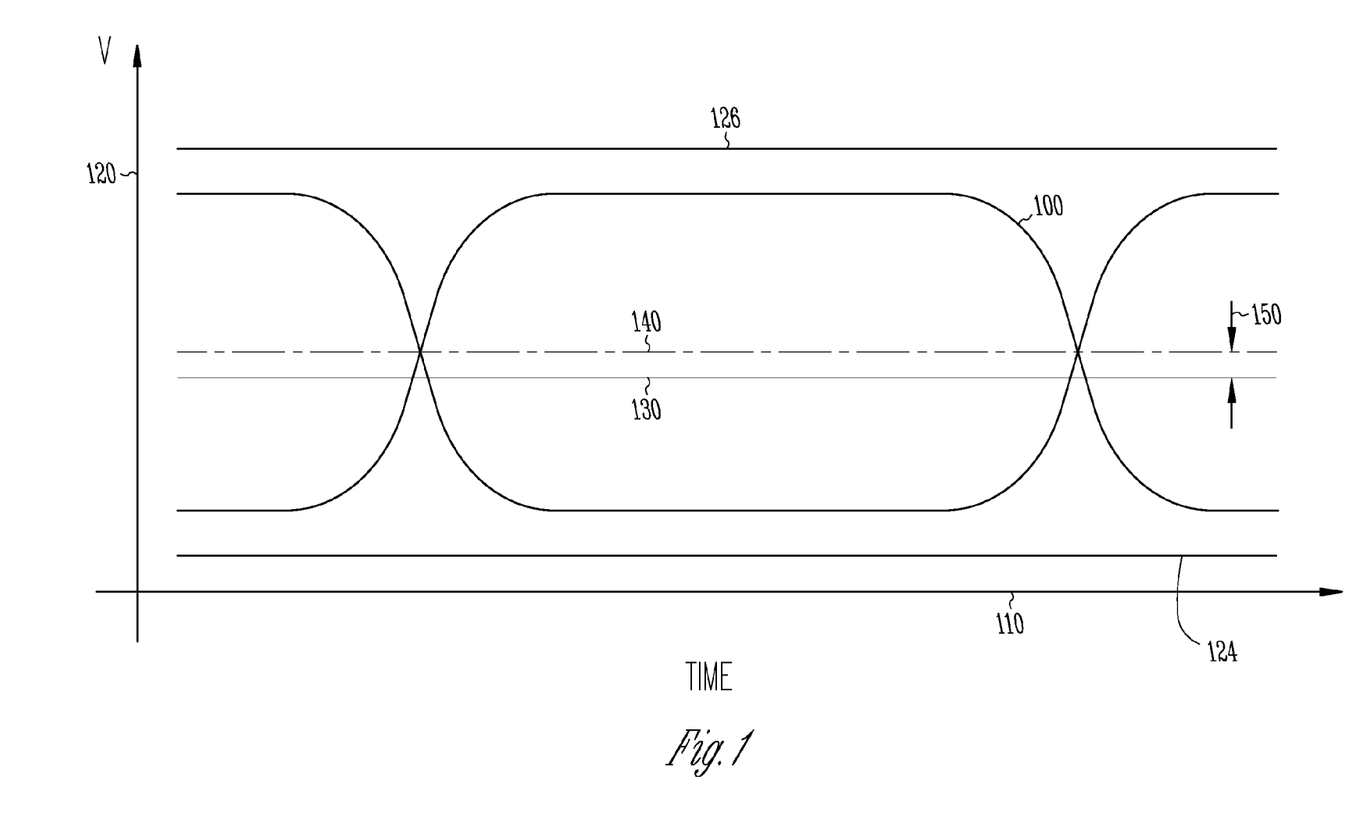
FIG. 1 is a graph of a data eye according to various embodiments of the invention.

FIG. 1 is a graph of a data eye 100 according to various embodiments of the invention. A horizontal axis 110 represents time and a vertical axis 120 represents a voltage of the data eye 100. The data eye 100 represents a data signal on a conductive line that is repetitively sampled. The data eye 100 is bounded by a lower voltage 124 and an upper voltage 126 of a system. The data eye 100 illustrates a time between rising and falling edges of the data signal, and defines an interval in which the data signal is valid.

The data signal is sensed with respect to a reference voltage 130 of a component receiving the data signal to generate the data eye 100. The data eye 100 represents multiple samples of the data signal. An ideal data eye 100 has complementary rising and falling edges that are balanced around the reference voltage 130. The data eye 100 can have a centerline voltage 140 that is offset with respect to the reference voltage 130 by a DC offset 150. The data signal has the same centerline voltage 140 of the data eye 100, and is transmitted around the centerline voltage 140. The DC offset 150 indicates a narrowed data eye 100 that limits the interval in which the data signal is valid.

The inventor has discovered that such challenges, as well as others, can at least sometimes be addressed by adjusting impedances in a termination to move the data eye 100 such that the centerline voltage 140 of the data eye 100 is substantially coincident with the reference voltage 130 and the DC offset 150 is approximately zero.

A termination is a dissipating and/or damping load, typically a resistive device, that has an impedance that is substantially similar to a characteristic impedance of a conductive line. The termination is used to damp and/or dissipate signal reflections on the conductive line. The termination can be placed in a driver or a receiver or in both a driver and a receiver connected to the conductive line.

Figure 2:
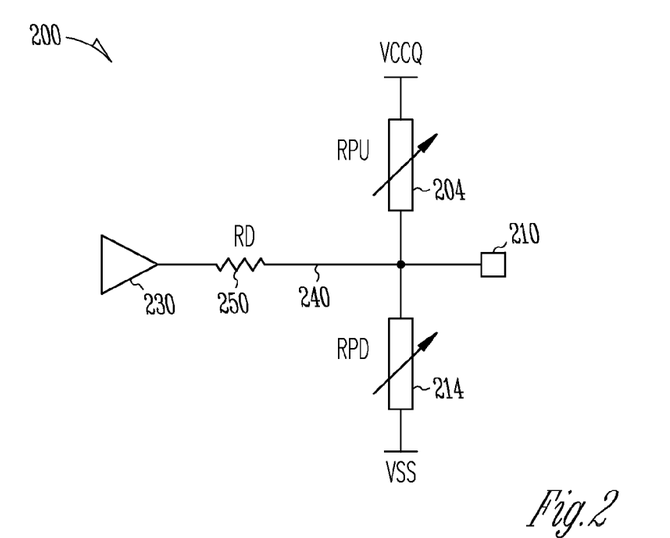
FIG. 2 is an electrical schematic diagram of an apparatus in the form of a driver and termination circuit according to various embodiments of the invention.

FIG. 2 is an electrical schematic diagram of an apparatus in the form of a driver and termination circuit 200 according to various embodiments of the invention. The driver and termination circuit 200 includes an adjustable pull-up impedance (RPU) 204 coupled between a first supply voltage VCCQ node and an external node 210 (e.g., a node used to couple the driver and termination circuit 200 to another circuit and/or device, such as an input and/or output pin, a terminal, a bond pad, a connection, etc.). The driver and termination circuit 200 also includes an adjustable pull-down impedance (RPD) 214 coupled between a second supply voltage VSS node and the external node 210. The second supply voltage VSS is generally a lower voltage than the first supply voltage, and is often a ground voltage reference. The RPU 204 and the RPD 214 together comprise a termination for the node 210. A ratio of the RPU 204 to the RPD 214 determines a centerline voltage of a data signal driven by a driver circuit 230 to the node 210 over a line 240. The driver circuit 230 has a characteristic resistance (RD) 250. The centerline of the data signal on the node 210 can be adjusted (e.g., changed) by adjusting the impedance (e.g., resistance) value of one or both of the RPU 204 and the RPD 214.

Figure 3:
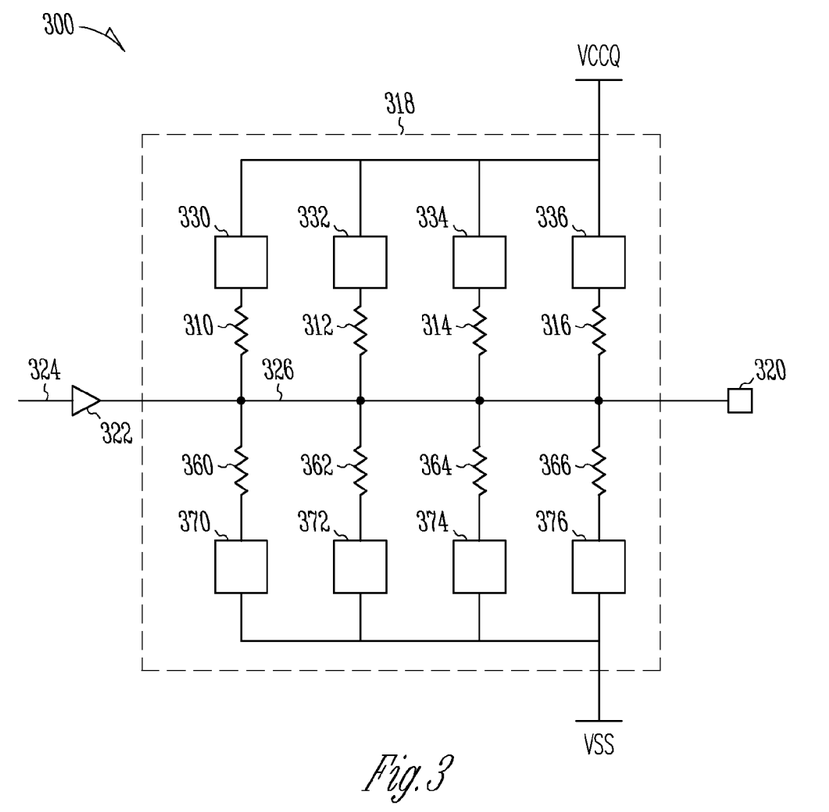
FIG. 3 is an electrical schematic diagram of an apparatus in the form of a driver and termination circuit according to various embodiments of the invention.

FIG. 3 is an electrical schematic diagram of an apparatus in the form of a driver and termination circuit 300 according to various embodiments of the invention. The driver and termination circuit 300 includes four resistors 310, 312, 314 and 316 of a termination 318 coupled in parallel to an external node 320. The four resistors 310, 312, 314 and 316 are pull-up impedances. A driver circuit 322 can drive a data signal from a line 324 to the external node 320 over a line 326. Each of the resistors 310, 312, 314 and 316 is coupled in series with a respective programmable element (e.g., a fuse, anti-fuse, etc.) 330, 332, 334 and 336. The programmable elements 330, 332, 334 and 336 can be statically programmed (e.g., blown or not blown, switched on or off, activated or inactivated, etc.) during production (e.g., during probe), for example, to either couple their respective resistor(s) 310, 312, 314 and 316 between the first supply voltage VCCQ node and the external node 320, or to not couple their respective resistor(s) 310, 312, 314 and 316 between the external node 320 and the first supply voltage VCCQ node (e.g., leaving the respective resistor(s) coupled only to the external node 320) to adjust a pull-up impedance of the driver and termination circuit 300.

Four resistors 360, 362, 364 and 366 in the termination 318 are similarly coupled in parallel to the external node 320. The four resistors 360, 362, 364 and 366 are pull-down impedances. Each of the resistors 360, 362, 364 and 366 is coupled in series with a respective programmable element 370, 372, 374 and 376. The programmable elements 370, 372, 374 and 376 can be statically programmed (e.g., blown or not blown) during production (e.g., during probe) to either couple their respective resistor(s) 360, 362, 364 and 366 between the second supply voltage VSS node and the external node 320, or to not couple their respective resistor(s) 360, 362, 364 and 366 between the external node 320 and the second supply voltage VSS node (e.g., leaving the respective resistor(s) coupled only to the external node 320) to adjust a pull-down impedance of the driver and termination circuit 300. A ratio of the pull-up impedance to the pull-down impedance determines the centerline voltage of a data signal transmitted from the driver and termination circuit 300 and the resulting data eye. There may be more or fewer than eight resistors coupled in parallel to the external node 320.

Figure 4:
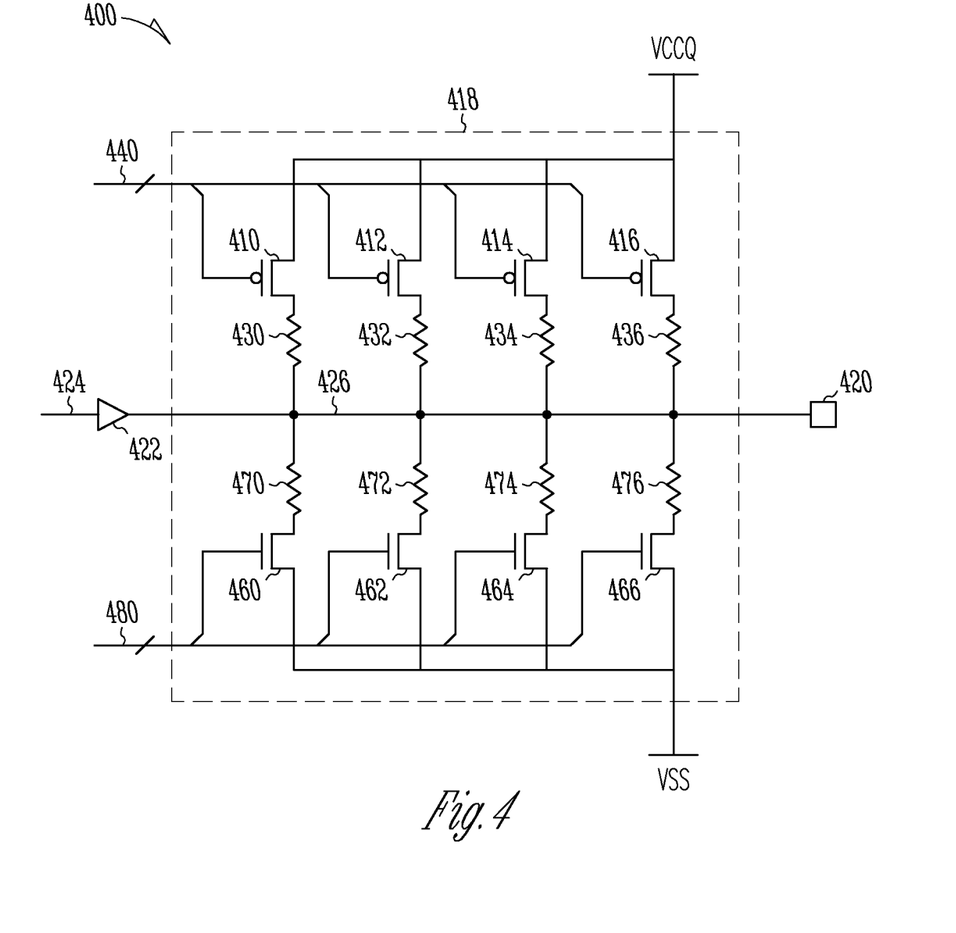
FIG. 4 is an electrical schematic diagram of an apparatus in the form of a driver and termination circuit according to various embodiments of the invention.

FIG. 4 is an electrical schematic diagram of an apparatus in the form of a driver and termination circuit 400 according to various embodiments of the invention. The driver and termination circuit 400 includes a termination 418 that includes four dynamically programmable elements, in the form of p-channel transistors 410, 412, 414 and 416, coupled in parallel between an external node 420 and a first supply voltage VCCQ node. The transistors 410, 412, 414 and 416 are pull-up impedances, and more particularly pull-up transistors. A driver circuit 422 can drive a data signal from a line 424 to the external node 420 over a line 426. Each of the transistors 410, 412, 414 and 416 is coupled in series with a respective resistor 430, 432, 434 and 436 in the termination 418 between the external node 420 and the first supply voltage VCCQ node. A gate of each of the transistors 410, 412, 414 and 416 is coupled to a respective control signal over a respective one of four control lines 440. The control signals are received from a controller (not shown) to dynamically program (e.g., switch on or switch off) the transistors 410, 412, 414 and 416 to adjust a pull-up impedance of the driver and termination circuit 400.

The termination 418 also includes four dynamically programmable elements, in the form of n-channel transistors 460, 462, 464 and 466 that are similarly coupled in parallel between the external node 420 and a second supply voltage VSS node. The transistors 460, 462, 464 and 466 are pull-down impedances, and more particularly pull-down transistors. Each of the transistors 460, 462, 464 and 466 is coupled in series with a respective resistor 470, 472, 474 and 476 in the termination 418 between the external node 420 and the second supply voltage VSS node. A gate of each of the transistors 460, 462, 464 and 466 is coupled to a respective control signal over a respective one of four control lines 480. The control signals are received from the controller (not shown) to dynamically program (e.g., switch on or switch off) the transistors 460, 462, 464 and 466 to adjust a pull-down impedance of the driver and termination circuit 400. A ratio of the pull-up impedance to the pull-down impedance determines the centerline voltage of a data signal transmitted from the driver and termination circuit 400 and the resulting data eye. In this manner, portions of the termination 418 are selectively programmed (e.g., activated or inactivated, depending on the programmable element and/or its configuration) to adjust an impedance of the termination 418 to adjust a centerline voltage of a data signal driven to the external node 420.

There may be more or fewer than four p-channel transistors and resistors coupled in parallel between the external node 420 and the first supply voltage VCCQ node. There may also be more or fewer than four n-channel transistors and resistors coupled in parallel between the external node 420 and the second supply voltage VSS node. The resistors 430, 432, 434, 436, 470, 472, 474 and 476 in the termination 418 are optional, and the termination 418 may include transistors without resistors.

Figure 5:
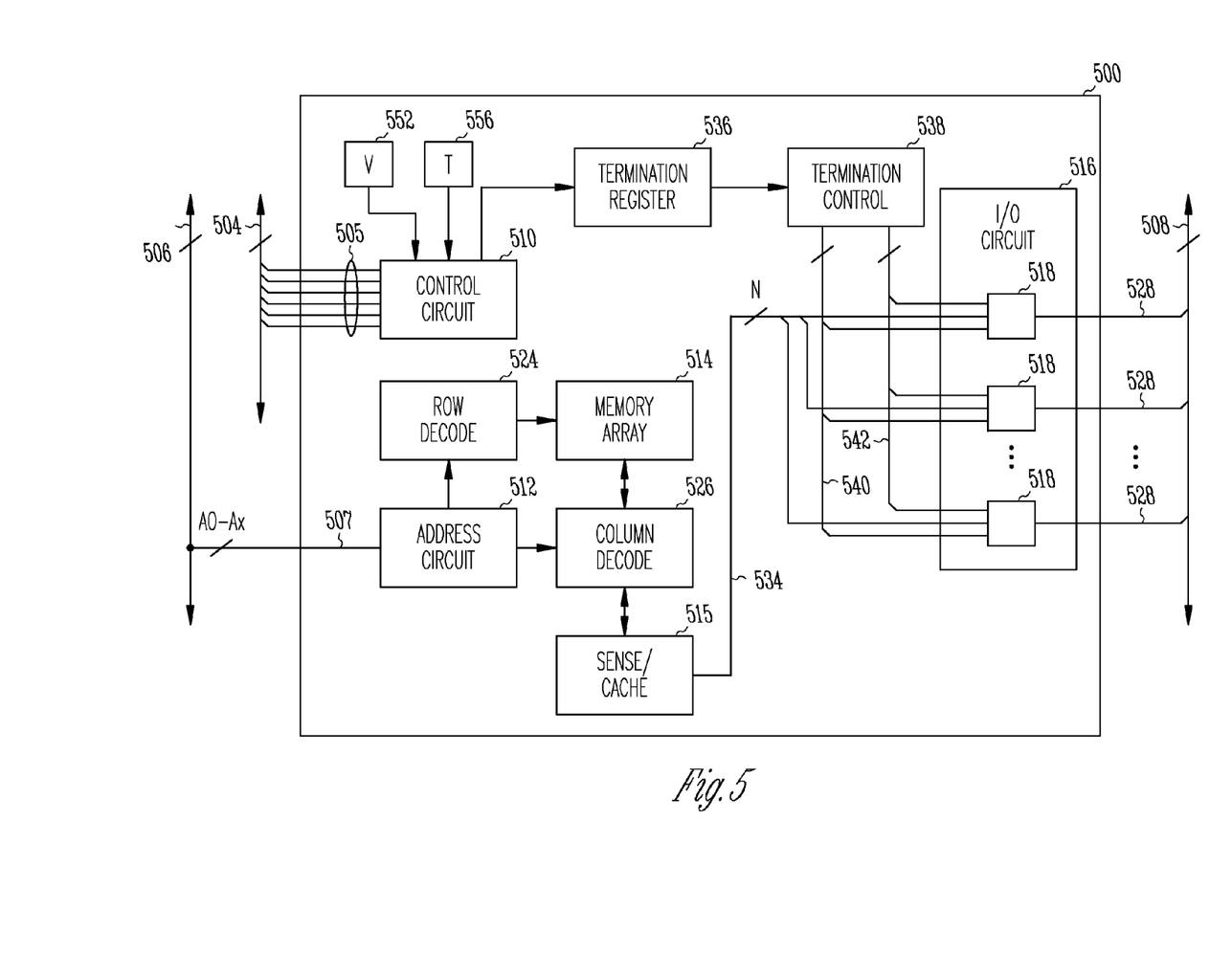
FIG. 5 is a block diagram of an apparatus in the form of a memory device according to various embodiments of the invention.

FIG. 5 is a block diagram of an apparatus in the form of a memory device 500 according to various embodiments of the invention. The memory device 500 is coupled to a control bus 504 to receive multiple control signals over control signal lines 505. The memory device 500 is also coupled to an address bus 506 to receive address signals A0-Ax on address signal lines 507 and to a data bus 508 to transmit and receive data signals. Although depicted as being received on separate physical busses, the signals could also be multiplexed and received on the same physical bus.

The memory device 500 includes one or more arrays 514 of memory cells that can be arranged in rows and in columns. The memory cells of the array 514 can be non-volatile memory cells (e.g., Flash memory cells) according to various embodiments of the invention. The memory device 500 can be a NOT AND (NAND) memory device. The array 514 can include multiple banks and blocks of memory cells residing on a single die or multiple dice as part of the memory device 500. The memory cells in the array 514 can be single level (SLC) or multilevel (MLC) memory cells.

An address circuit 512 can latch address signals A0-Ax received on the address signal lines 507. The address signals A0-Ax can be decoded by a row decoder 524 and a column decoder 526 to access data stored in the array 514. The memory device 500 can read data in the array 514 by sensing voltage or current changes in memory cells in the array 514 using sense devices in a sense/cache circuit 515.

A data input and output (I/O) circuit 516 implements bi-directional data communication over external (e.g., data I/O) nodes 528 coupled to the data bus 508. The I/O circuit 516 includes N driver and receiver circuits 518 according to various embodiments of the invention. The memory device 500 includes a controller that is configured to support operations of the memory device 500, such as writing data to and/or erasing data from the array 514. The controller can comprise, for example, control circuitry 510 (e.g., configured to implement a state machine) on a same or different die than that which includes the memory array 514 and/or any or all of the other components of memory device 500. The controller can comprise control circuitry 510, firmware, software or combinations of any or all of the foregoing. Data is transferred between the sense/cache circuit 515 and the I/O circuit 516 over N signal lines 534. Each driver and receiver circuit 518 includes a driver and termination circuit such as one of the driver and termination circuits 200, 300 or 400 shown in FIGS. 2, 3 and 4, respectively.

The memory device 500 includes a termination register 536 that is configured to store termination values (e.g., an impedance characteristic to be obtained) according to various embodiments of the invention. The termination register 536 can be volatile or non-volatile storage within the memory device 500. The termination register 536 can be a portion of the array 514 according to various embodiments of the invention. A termination controller (e.g., termination control circuit 538, firmware, software or combinations of any or all of the foregoing) is configured to program (e.g., select) impedances of the terminations in the driver and receiver circuits 518 utilizing (e.g., driving), for example, termination control signal lines 540 and 542 based on the termination values in the termination register 536. The control circuit 510 is configured, at least in part, to manage the operation of termination register 536 and the termination control circuit 538. For example, the control circuit 510 can write termination values into the termination register 536. The memory device 500 includes a voltage sensing circuit V 552 coupled to send a voltage signal to the control circuit 510 to indicate a level of a voltage associated with the memory device 500 (e.g., received by the memory device and/or with which the memory device is operating). The memory device 500 also includes a temperature sensing circuit T 556 coupled to send a temperature signal to the control circuit 510 to indicate a temperature associated with the memory device 500 (e.g., a temperature at a particular location or across locations within the device). The control circuit 510 can adjust the termination values in the termination register 536 based on changes in the voltage signal and/or the temperature signal. The control circuit 510 can also adjust the termination values in the termination register 536 based on control signals received from another device (not shown), such as those received through the control bus 504.

The ratio of the pull-up impedances to the pull-down impedances in the driver and receiver circuits 518 can be dynamically programmed during operation of the memory device 500. Alternatively, the ratio of the pull-up impedances to the pull-down impedances in the driver and receiver circuits 518 can be statically programmed (e.g., set) only once such as, for example, during production of a device including driver and termination circuits such as the driver and termination circuit 200, 300 or 400 shown in FIGS. 2, 3 and 4, respectively, according to various embodiments of the invention.

Figure 6:
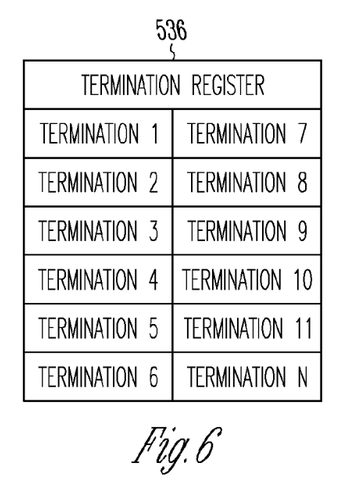
FIG. 6 is a block diagram of a termination register according to various embodiments of the invention.

FIG. 6 is a block diagram of the termination register 536 according to various embodiments of the invention. The termination register 536 can include N fields for storing termination values according to various embodiments of the invention. The termination register 536 can be loaded during an initialization operation of the memory device 500. The termination values can be written to the array 514 to be accessed during the initialization operation to load the termination register 536, for example. The termination values in the termination register 536 can be adjusted by the control circuit 510.

Figure 7:
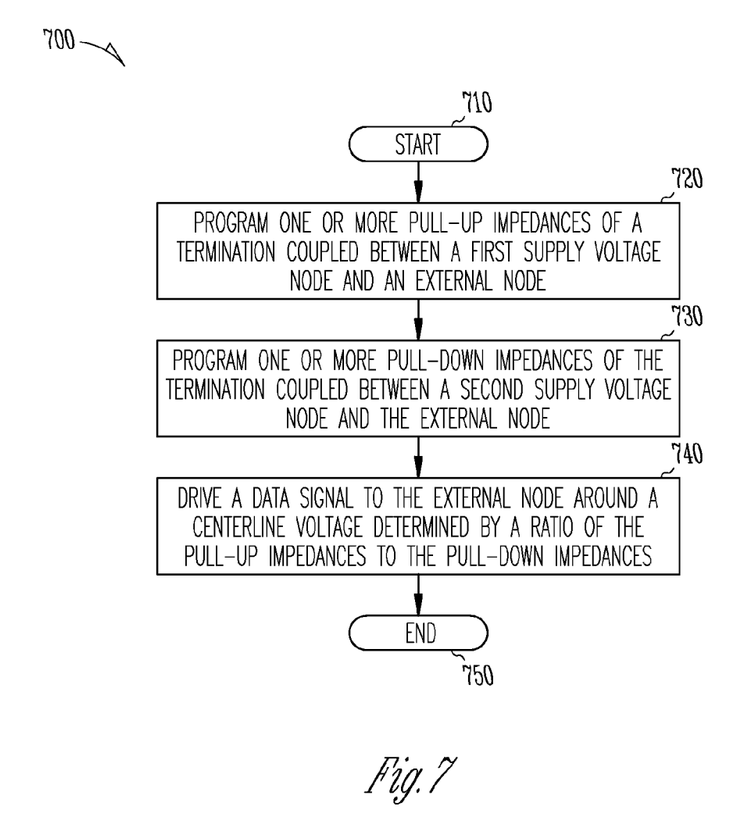
FIG. 7 is a flow diagram of one method according to various embodiments of the invention.

FIG. 7 is a flow diagram of one method 700 according to various embodiments of the invention. In block 710, the method 700 begins. In block 720, one or more pull-up impedances of a termination, coupled between a first supply voltage node and an external node, are programmed (e.g., switched on). In block 730, one or more pull-down impedances of the termination, coupled between a second supply voltage node and the external node, are programmed (e.g., switched on). In block 740, a data signal is driven to the external node around a centerline voltage determined by a ratio of the pull-up impedances to the pull-down impedances. In block 750, the method 700 ends. Various embodiments may have more or fewer activities than those shown in FIG. 7. The activities shown may be accomplished in the illustrated order, or in another order. Some activities may be substituted for others.

Figure 8:
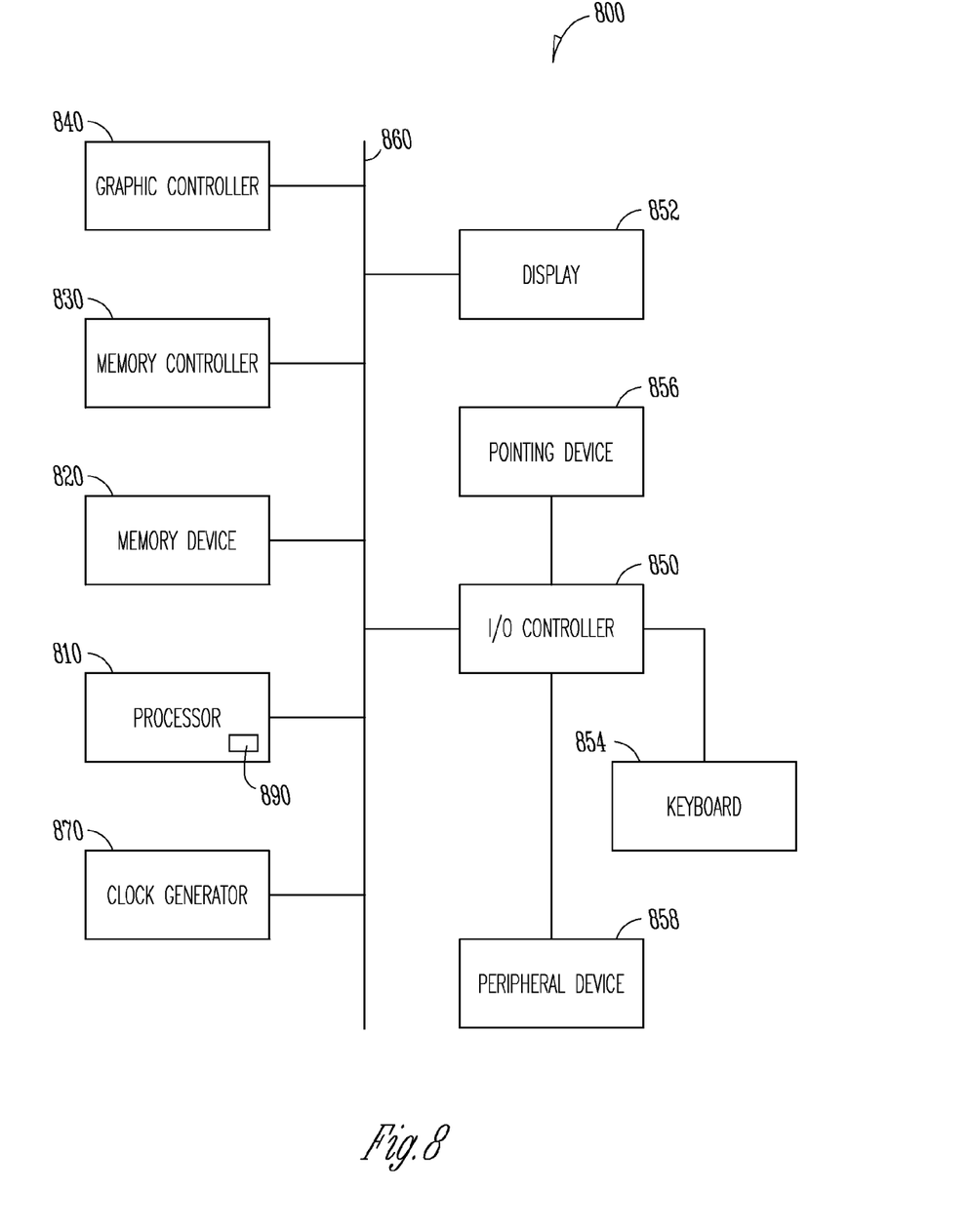
FIG. 8 is a diagram illustrating an apparatus in the form of a system according to various embodiments of the invention.

FIG. 8 is a diagram illustrating an apparatus in the form of a system 800 according to various embodiments of the invention. The system 800 may include a processor 810, a memory device 820, a memory controller 830, a graphic controller 840, an input and output (I/O) controller 850, a display 852, a keyboard 854, a pointing device 856, and a peripheral device 858. A bus 860 couples all of these devices together.

A clock generator 870 can be coupled to the bus 860 to provide a clock signal to at least one of the devices of the system 800 through the bus 860. The clock generator 870 may include an oscillator in a circuit board such as a motherboard. Two or more devices shown in system 800 may be formed in a single integrated circuit chip. The processor 810 can include a driver and termination circuit 890 that can be one of the driver and termination circuits 200, 300 or 400 described herein and shown in FIGS. 2, 3 and 4, respectively, according to various embodiments of the invention. The bus 860 may be used to interconnect traces on a circuit board and may have one or more cables. The bus 860 may couple the devices of the system 800 by wireless mechanisms, such as by electromagnetic radiation, for example, radio waves. The peripheral device 858 coupled to the I/O controller 850 may be a printer, an optical device such as a CD-ROM and a DVD reader and writer, a magnetic device reader and writer such as a floppy disk driver, or an audio device such as a microphone.

The memory device 820 can be the memory device 500 described herein and shown in FIG. 5 according to various embodiments of the invention. The control circuit 510 can adjust the termination values in the termination register 536 based on an analysis of the system 800. The centerline voltage of data signals transmitted by the memory device 500 may need to be adjusted to accommodate other devices in the system 800 such as the processor 810. The ratio of the pull-up impedances to the pull-down impedances in the driver and receiver circuits 518 can be adjusted during operation of the memory device 500. A device in the system 800 such as the processor 810 can send the memory device 500 a request signal indicating what the centerline voltage should be, and the control circuit 510 can adjust the termination values in the termination register 536 based on the request signal.

The system 800 represented by FIG. 8 may include computers (e.g., desktops, laptops, hand-helds, servers, network appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio 3) players, video games, watches, etc.), and the like.

The various embodiments of the invention described herein and shown in FIGS. 1-8 can improve I/O speeds when transmitted data signals are within specifications. An adjustment of a data eye can be accomplished from a single semiconductor device. The adjustment of the data eye can be independent for each channel in a device with multiple channels. An adjustment of a data eye can also be accomplished from multiple devices terminating simultaneously. For example, multiple devices can terminate in parallel to provide stronger or more precise termination. In such a case, the center point could be adjusted by the ratio of the PU and PD impedances on a single device or multiple devices. The various embodiments of the invention can, for example, be applied to non-volatile semiconductor memories (NVSMs).

Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features can be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
selectively programming portions of a termination circuit coupled to a node in a first device to adjust an impedance of the termination circuit to adjust a centerline voltage of a data signal driven to the node that is coupled to a system, selectively programming the portions comprising:
switching on a transistor in the termination circuit coupled between a supply voltage and the node responsive to a termination value stored in a register; and
adjusting the termination value stored in the register responsive to a change in a voltage associated with an apparatus including the termination circuit.

2. The method of claim 1, further comprising adjusting a ratio of a pull-up impedance to a pull-down impedance of a termination in each of a plurality of devices in the system including the first device to adjust the centerline voltage of the data signal to be transmitted between the devices in the system.

3. The method of claim 1, further comprising adjusting the centerline voltage of the data signal to be transmitted between a plurality of devices in the system including the first device by adjusting an impedance of a termination circuit in each of a plurality of the devices that are terminating simultaneously.

4. The method of claim 1, further comprising selectively programming portions of a plurality of termination circuits coupled to respective nodes in the first device to adjust an impedance of each termination circuit to adjust a centerline voltage of a data signal driven to the respective node.

5. The method of claim 1, wherein switching on a transistor in the termination circuit comprises switching on a transistor coupled in series with a resistor between the node and the supply voltage.

6. A method comprising:
selectively programming portions of a termination circuit coupled to a node in a first device to adjust an impedance of the termination circuit to adjust a centerline voltage of a data signal driven to the node that is coupled to a system, selectively programming the portions comprising:
switching on a transistor in the termination circuit coupled between the supply voltage and the node responsive to a termination value stored in a register;
analyzing the system; and
adjusting the termination value stored in the register responsive to the analysis of the system.

7. A method comprising:
selectively programming portions of a termination circuit coupled to a node in a first device to adjust an impedance of the termination circuit to adjust a centerline voltage of a data signal driven to the node that is coupled to a system, selectively programming the portions comprising:
switching on a transistor in the termination circuit coupled between a supply voltage and the node responsive to a termination value stored in a register; and
adjusting the termination value stored in the register responsive to a control signal received from a second device coupled to the system.

8. The method of claim 7, further comprising:
receiving a request signal from the second device to indicate the centerline voltage; and
adjusting the termination value stored in the register responsive to the request signal received from the second device.

9. The method of claim 8, wherein:
the first device comprises a memory device; and
the second device comprises a processor.

10. A method comprising:
selectively programming portions of a termination circuit coupled to a node in a first device to adjust an impedance of the termination circuit to adjust a centerline voltage of a data signal driven to the node that is coupled to a system, selectively programming the portions comprising:
switching on a transistor in the termination circuit coupled between a supply voltage and the node responsive to a termination value stored in a register; and
adjusting the termination value stored in the register responsive to a change in a temperature associated with an apparatus including the termination circuit.

11. An apparatus comprising:
a plurality of pull-up impedances coupled between an external node and a first supply voltage node and configured to be programmed to adjust a centerline voltage of a data signal on the external node;
a plurality of pull-down impedances coupled between the external node and a second supply voltage node and configured to be programmed to adjust the centerline voltage of the data signal on the external node;
a driver circuit coupled to drive the data signal to the external node; and
a controller configured to program at least a portion of the pull-up impedances and at least a portion of the pull-down impedances to adjust the centerline voltage of the data signal on the external node, wherein the controller comprises:
a control circuit;
a termination register coupled to the control circuit; and
a termination control circuit coupled to the control circuit and the termination register.

12. The apparatus of claim 11, wherein
each of the impedances comprises a respective resistor coupled in series with a respective programmable element.

13. The apparatus of claim 12, wherein the programmable elements comprise transistors.

14. The apparatus of claim 12, wherein the programmable elements comprise fuses or anti-fuses.

15. The apparatus of claim 11, wherein:
the pull-down impedances comprise pull-down transistors, each pull-down transistor being coupled in series with a respective resistor between the external node and the second supply voltage node; and
the pull-up impedances comprise pull-up transistors, each pull-up transistor being coupled in series with a respective resistor between the external node and the first supply voltage node.

16. An apparatus comprising:
a plurality of pull-up impedances coupled between an external node and a first supply voltage node and configured to be programmed to adjust a centerline voltage of a data signal on the external node;
a plurality of pull-down impedances coupled between the external node and a second supply voltage node and configured to be programmed to adjust the centerline voltage of the data signal on the external node;
a driver circuit coupled to drive the data signal to the external node; and
a controller configured to program at least a portion of the pull-up impedances and at least a portion of the pull-down impedances to adjust the centerline voltage of the data signal on the external node, wherein the controller is configured to adjust the programming of the at least a portion of the pull-up impedances and the at least a portion of the pull-down impedances responsive to changes in temperature or changes in a voltage or changes in the temperature and changes in the voltage.

* * * * *